United States Patent

Simms

[15] 3,701,051

[45] Oct. 24, 1972

[54] STABLE OSCILLATOR

[72] Inventor: Dudley V. Simms, 14 Civic Center Drive, East Brunswick, N.J. 08816

[22] Filed: July 28, 1971

[21] Appl. No.: 166,788

[52] U.S. Cl. ............331/107 T, 307/322, 331/108 A

[51] Int. Cl. ..............................................H03b 7/08

[58] Field of Search ........331/108 A, 107 T; 307/322

[56] References Cited

UNITED STATES PATENTS 3,523,257 8/1970 Wachs....................331/107 T

*Primary Examiner*—John Kominski

*Attorney*—Rudolph J. Jurick

[57] ABSTRACT

A configuration of complementary transistors and a pair of matched tunnel diodes forming a stable, sinusoidal oscillator.

5 Claims, 2 Drawing Figures

DUDLEY V. SIMMS
INVENTOR.

BY Rudolph J. Jurick
ATTORNEY

STABLE OSCILLATOR

BACKGROUND OF THE INVENTION

The invention lies in the field of transistor oscillator circuits.

A regenerative circuit can be formed by connecting the emitters of a pair of complementary transistors to a D.C. voltage source and interconnecting the transistor bases and collectors. By inserting a pair of matched diodes into the base circuits of the transistors and maintaining the applied voltage at a magnitude such that the valley voltage of the diodes cannot be exceeded during the time the transistors are turned on, the circuit will oscillate at a stable frequency which depends upon the maximum frequency region of the transistors selected.

SUMMARY OF THE INVENTION

The base of a PNP transistor is connected to the collector of an NPN transistor through a first tunnel diode, the collector of the PNP transistor is connected to the base of the NPN transistor through a second tunnel diode, and the transistor emitters are connected to a D.C. voltage. If the magnitude of the D.C. voltage does not exceed the valley voltage of the diodes during the turn on time of the transistors, the circuit oscillates due to the negative resistance of the diodes in the peak to valley region. Since the speed of the tunnel diodes far exceeds the speed of the transistors, one or both transistors will control the frequency of oscillations.

An object of this invention is the provision of an oscillator circuit formed of two complementary transistors and two tunnel diodes connected as a regenerative circuit.

An object of this invention is the provision of a stable, accurate oscillator circuit in which the oscillation frequency is determined by the internal time constants of a pair of transistors.

An object of this invention is the provision of an oscillator circuit comprising a pair of transistors and a pair of tunnel diodes and wherein stable operating conditions are achieved without incorporation of extraneous inductance or capacitance.

The above stated and other objects and advantages of the invention will become apparent from the following description when taken in connection with the drawings. It will be understood, however, that the drawings are for purposes of illustration and are not to be construed as defining the scope or limits of the invention, reference being had for the latter purpose to the claims appended hereto.

BRIEF DESCRIPTION OF DRAWINGS

In the drawings wherein like reference characters denote like parts in the several views.

DESCRIPTION OF PREFERRED EMBODIMENT

Figure 1:
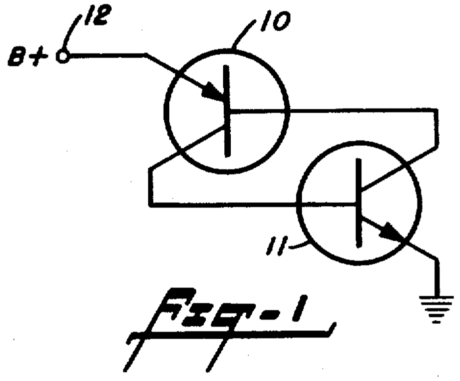
FIG. 1 is a circuit diagram showing two transistors connected to form a conventional regenerative circuit.

Referring first to FIG. 1, it is well known that a pair of transistors, connected as shown, forms a regenerative circuit, the transistors 10 and 11 being of the PNP and NPN type, respectively. The application of a critical + voltage to the terminal 12 will cause both transistors to turn on and quickly reach saturation, under which condition the current flowing in each base is limited only by the saturation resistance of the transistors and the magnitude of the applied voltage. Within the power ratings of the transistors, the circuit will remain turned on as long as the applied voltage remains at or above the critical value.

Figure 2:
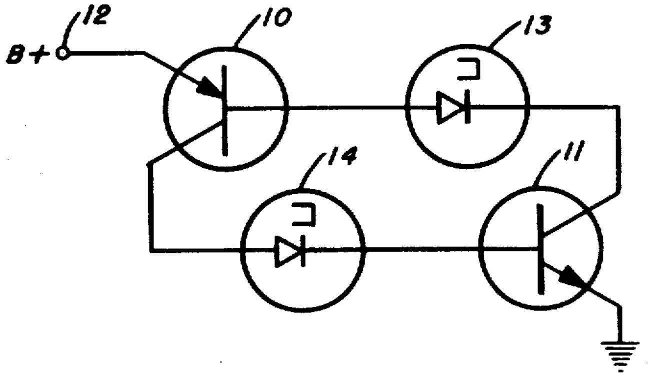
FIG. 2 is a circuit diagram of a stable oscillator made in accordance with the invention.

Reference now is made to FIG. 2, wherein a pair of tunnel diodes 13, 14 are connected in the base-collector circuits of the transistors 10 and 11. The transistors are selected such that they have the same gain-frequency parameters in the small signal area, where such measurements are usually made. The diodes are matched for peak and valley currents which fall within the range of maximum activity of the transistors, that is, the peak current should not cause the saturation of either transistor and the valley current should be above the cut-off current of either transistor. Preferably, the transistors should have approximately equal gain at the current change specified for the diodes. The circuit is considered regenerative in that the base currents are amplified by both transistors, once the critical value has been reached and this amplifying action continues until both transistors are saturated. With the tunnel diodes connected as shown, a limiting factor is placed on the base currents by the valley currents of the diodes. Since the tunnel diode transition from peak to valley current is a negative resistance effect, the transistors are turned off. This turning off action of the transistors returns the diodes to their peak current region which, in turn, turns the transistors back on. This action continues and sustained oscillations are produced, provided the applied voltage has a magnitude such that the valley voltage of the diodes is not exceeded during the turn on time of the transistors. Since the speed of tunnel diodes generally far exceeds the speed of transistors, one or both transistors will control the frequency of oscillations.

Transistors, as a class of active devices, exhibit gain-frequency ($F_T$) characteristic which is defined as the frequency at which the ratio of input power to output power is unity. Transistors also have another frequency limit ($F_{max}$) which is the limit imposed by the internal time constants of the device. This latter frequency is predictable and constant, being based upon the geometry of the device and fabrication techniques, and therefore, the circuit will oscillate in a stable mode. The tunnel diodes always tend to drive the transistors into the ($F_{max}$) region and both transistors play a part in the control of the frequency of operation. The circuit gain is that provided by the tunnel diodes since the transistors are operating at unity gain or less. If one of the transistors is selected to have a lower gain-frequency ($F_T$) characteristic than the other, then this transistor becomes the controlling factor in determining operating frequency. This is so because the slower transistor would reach ($F_T$) or ($F_{max}$) while the diodes and the other transistor still had gain and therefore, these components would be operating at the frequency provided by the selected, slower transistor. Under these conditions the circuit gain would be increased by the gain of the second transistor at the operating frequency, plus the gain of the diodes. Selecting the PNP transistor 10 as the slower transistor is preferred. In any event, the introduction of extraneous inductance and capacitance is not required to achieve stable operating conditions. Also, careful matching of the transistors will provide conditions where there will be no gain for harmonics or spurious oscillations.

Considering a given pair of transistors, the power requirements of the tunnel diodes may be selected such that the slower transistor cannot supply the power at rated ($F_T$). Under these conditions, circuit operation may shift to some point on the 6 db slope or ($F_T$) will shift downward. By judicious selection of transistors and tunnel diodes, the frequency of operation can be controlled within precise limits.

The input voltage is critical in that it must be large enough to turn the circuit on and yet not exceed a value which would permit the tunnel diodes to switch beyond the valley point, with all of the voltage drops in each side of the circuit taken into consideration. Because the voltage can change only over a narrow range while the circuit is oscillating, the output frequency is not voltage-dependent. A sinusoidal output is obtained because the circuit operates over the negative resistance slope of the combined transistor-tunnel diode pairs and because one transistor can be operated in the region where no gain would be available for the generation of harmonics frequencies.

The following is an example of the specific components and values for the circuit shown in FIG. 2.

Transistor 10 — 2N321 germanium with ($F_T$) = 3MHZ

Transistor 11 — 2N706 silicon with ($F_T$) = 150 MHZ

Tunnel Diodes 13 and 14 — IN-3717 general purpose diodes with peak current of 4.7 milliamperes

Having now described the invention what I desire to protect by Letters Patent is set forth in the following claims.

I claim:

1. An oscillator comprising,
   a. first and second complementary transistors having emitters connected to a D.C. voltage source,
   b. a first tunnel diode connected between the base of the first transistor and the collector of the second transistor,
   c. a second tunnel diode connected between the collector of the first transistor and the base of the second transistor; the diodes being connected to pass current from the positive to the negative side of the voltage source and the magnitude of the voltage source being large enough to turn on the transistors but not exceeding the valley voltage of the diodes.

2. The invention as recited in claim 1, wherein the diodes have matched peak and valley currents within the range of maximum activity of the transistors.

3. The invention as recited in claim 2, wherein the transistors have approximately equal gain at the current change of the diodes.

4. The invention as recited in claim 2, wherein the said first and second transistors are of the PNP and NPN type, respectively.

5. The invention as recited in claim 4, wherein the PNP transistor has a gain-frequency characteristic lower than that of the NPN transistor.

* * * * *